United States Patent
Yu et al.

(10) Patent No.: US 8,304,871 B2
(45) Date of Patent: Nov. 6, 2012

(54) EXPOSED DIE PACKAGE FOR DIRECT SURFACE MOUNTING

(75) Inventors: Frank Yu, Taipei Hsien (TW); Lance Wright, Allen, TX (US); Chien-Te Feng, Taipei Hsien (TW); Sandra Horton, Farmers Branch, TX (US)

(73) Assignee: Texas Instruments Incorporated, Dallas, TX (US)

( * ) Notice: Subject to any disclaimer, the term of this patent is extended or adjusted under 35 U.S.C. 154(b) by 16 days.

(21) Appl. No.: 13/080,320

(22) Filed: Apr. 5, 2011

(65) Prior Publication Data

US 2012/0256306 A1  Oct. 11, 2012

(51) Int. Cl.
*H01L 23/495* (2006.01)

(52) U.S. Cl. .............. 257/676; 257/E23.037; 257/675; 257/707; 438/123; 438/125

(58) Field of Classification Search ........... 257/E23.037, 257/E23.103, 676, 675, 666, 686, 687, 684, 257/690, 705–707, 713, 723, 720, 777, 786, 257/796; 438/122, 123, 125
See application file for complete search history.

(56) References Cited

U.S. PATENT DOCUMENTS

| | | | |
|---|---|---|---|
| 5,293,301 A * | 3/1994 | Tanaka et al. ............ | 361/707 |
| 5,604,376 A | 2/1997 | Hamburgen et al. | |
| 5,616,957 A * | 4/1997 | Kajihara ................... | 257/712 |
| 5,625,226 A * | 4/1997 | Kinzer ...................... | 257/705 |
| 5,869,883 A * | 2/1999 | Mehringer et al. ........ | 257/667 |
| 6,198,171 B1 * | 3/2001 | Huang et al. .............. | 257/787 |
| 6,559,525 B2 * | 5/2003 | Huang ....................... | 257/675 |
| 6,590,281 B2 * | 7/2003 | Wu et al. .................. | 257/684 |
| 6,601,294 B1 * | 8/2003 | Jiang et al. ............... | 29/841 |
| 7,141,867 B2 * | 11/2006 | Tao et al. .................. | 257/666 |
| 7,151,311 B2 * | 12/2006 | Nakajima et al. ......... | 257/728 |
| 7,196,904 B2 * | 3/2007 | Ku ............................. | 361/703 |
| 7,315,077 B2 * | 1/2008 | Choi et al. ................ | 257/666 |
| 7,554,179 B2 * | 6/2009 | Shim et al. ................ | 257/675 |
| 7,598,603 B2 * | 10/2009 | Otremba .................... | 257/675 |
| 7,642,643 B2 | 1/2010 | Hall et al. | |
| 7,745,927 B2 | 6/2010 | Ryan et al. | |
| 2003/0092205 A1 * | 5/2003 | Wu et al. .................... | 438/15 |
| 2009/0026619 A1 | 1/2009 | Zeng et al. | |

* cited by examiner

*Primary Examiner* — Chris Chu
(74) *Attorney, Agent, or Firm* — Steven A. Shaw; W. James Brady; Frederick J. Telecky, Jr.

(57) ABSTRACT

A packaged semiconductor device includes a semiconductor die including a substrate having a topside including active circuitry and a bottomside with at least one backside metal layer directly attached. A package including a molding material having a die pad and a plurality of leads is encapsulated within the molding material, wherein the leads include an exposed portion that includes a bonding portion. The topside of the semiconductor die is attached to the die pad, and the package includes a gap that exposes the backside metal layer along a bottom surface of the package. Bond wires couple pads on the topside of the semiconductor die to the leads. The bonding portions, the molding material along the bottom surface of the package, and the backside metal layer are all substantially planar to one another.

16 Claims, 2 Drawing Sheets

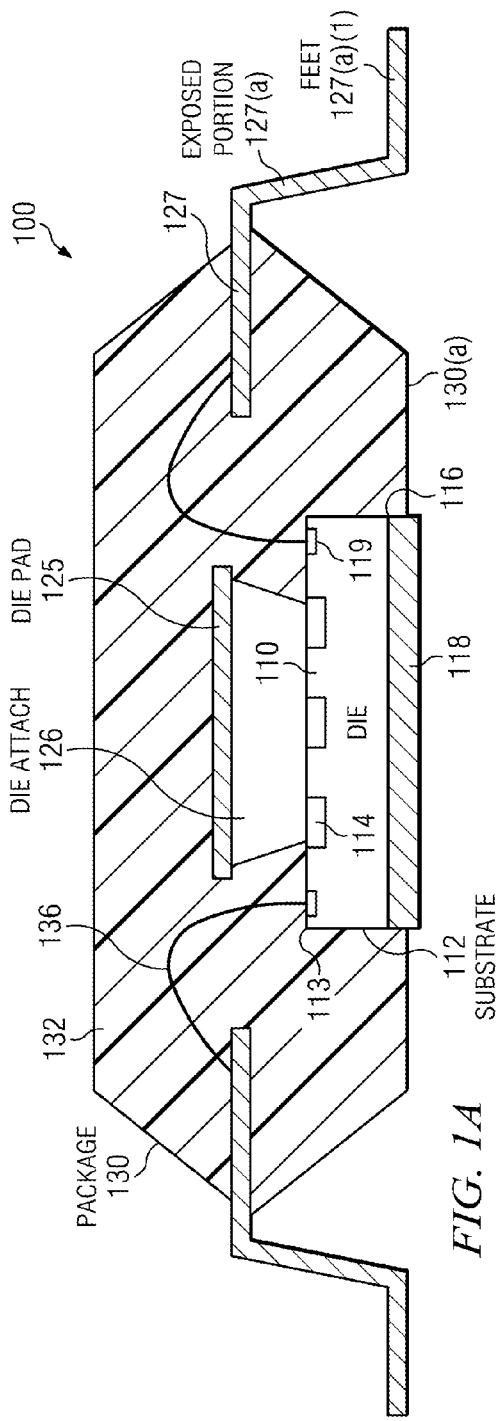
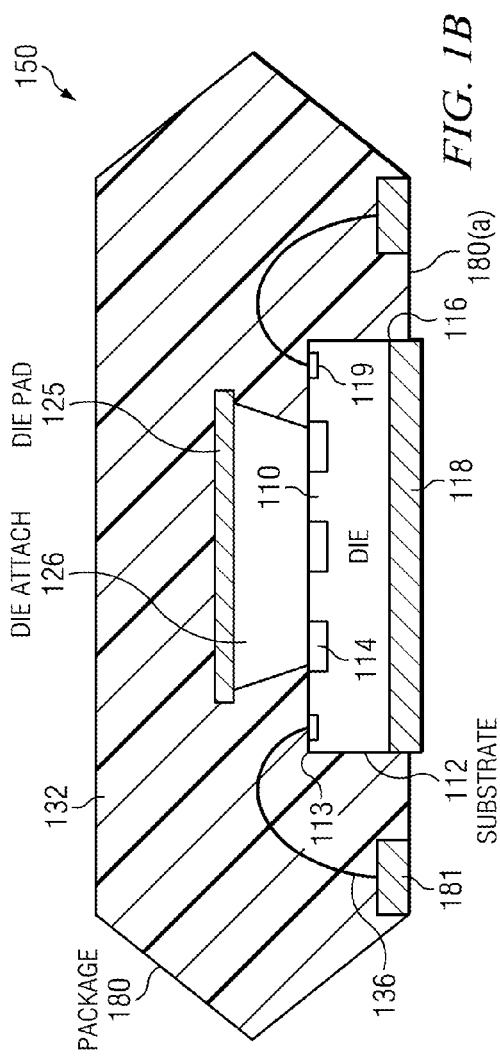

EXPOSED DIE PACKAGE FOR DIRECT SURFACE MOUNTING

FIELD

Disclosed embodiments relate to packaged semiconductor devices including die with exposed substrates (e.g., silicon) and electronic assemblies including such packaged semiconductor devices.

BACKGROUND

For a semiconductor package that includes at least one semiconductor die therein, particularly for power integrated circuits (ICs), the problem of heat dissipation is an important issue. A semiconductor package with poor heat dissipation may not just produce errors, but may also reduce product reliability and greatly increase manufacturing cost.

One known power package that includes enhanced cooling is an exposed heat slug package that comprises a heat slug (e.g., copper slug) that is exposed on the bottomside of the package. The die is bonded face (active topside) up on top of the heat slug with a thermally conductive die attach material. Another known power package is an exposed silicon package that flip chip mounts the semiconductor die on a die pad and exposes the bottomside of the semiconductor die. A heat sink is then thermally coupled to the bottomside of the semiconductor die using a thermal grease.

Both of these known power packages have significant thermal resistance that reduces cooling performance due to multiple interfaces in the cooling path that increases the thermal resistance of the package. For example, the exposed heat slug package includes the semiconductor substrate (e.g., silicon), the die attach material, the heat slug and solder in the cooling path from the topside of the semiconductor to an underlying workpiece, such as a printed circuit board (PCB). Similarly, the exposed silicon package includes the substrate, thermal grease and the heat sink in the cooling path from the topside of the semiconductor die to the atmosphere.

SUMMARY

Disclosed embodiments recognize conventional packaged semiconductor devices, particularly high power semiconductor devices, can reach high junction temperatures during their operation due to high thermal resistance resulting from a large thermal resistance drop across multiple interfaces that interferes with heat dissipation from the packaged device to its heat sink during its operation. By having the bonding portion of the leads, the bottom surface of the package, and the backside metal of the semiconductor die all be substantially planar to one another allows direct soldering of the packaged semiconductor device to a workpiece such as a printed circuit board (PCB), and as a result improved heat dissipation to the workpiece (e.g., PCB) due to a reduction in interfaces in the thermal cooling path to the workpiece.

One disclosed embodiment comprises a packaged semiconductor device that includes a semiconductor die comprising a substrate having a topside including active circuitry and a bottomside, and at least one backside metal layer that is directly attached to the bottomside. A package including a molding material comprising a die pad and a plurality of leads is encapsulated within the molding material, wherein the leads include an exposed portion that includes a bonding portion. The topside of the semiconductor die is attached to the die pad, and the package includes a gap that exposes the backside metal layer along a bottom surface of the package. Bond wires couple pads on the topside of the semiconductor die to the leads. The bonding portions, the bottom surface of the package, and the backside metal layer are all substantially planar to one another.

Another disclosed embodiment comprises an electronic assembly comprising a disclosed packaged semiconductor device and a PCB including a plurality of surface pads. Direct solder connections are provided from the backside metal layer and the bonding portions of the leads to the surface pads on the PCB. Direct solderability provided by disclosed packaged semiconductor device reduces assembly cost as compared to conventional assembly, such as by eliminating the need for thermal grease and heat sinks, and added processing such to attach a heat sink. Moreover, direct soldering reduces board space for PCB assemblies, and eases PCB layout by enabling use of surface mount device (SMD) rules.

BRIEF DESCRIPTION OF THE DRAWINGS

FIG. 1A is a cross sectional depiction of an example packaged semiconductor device comprising a leaded package, with backside metal of the semiconductor die exposed along a bottom surface of the package for direct surface mounting, according to an example embodiment.

FIG. 1B is a cross sectional depiction of an example packaged semiconductor device comprising a leadless package, with backside metal of the semiconductor die exposed at along a bottom surface of the surface of the package, according to an example embodiment.

DETAILED DESCRIPTION

Figure 2:
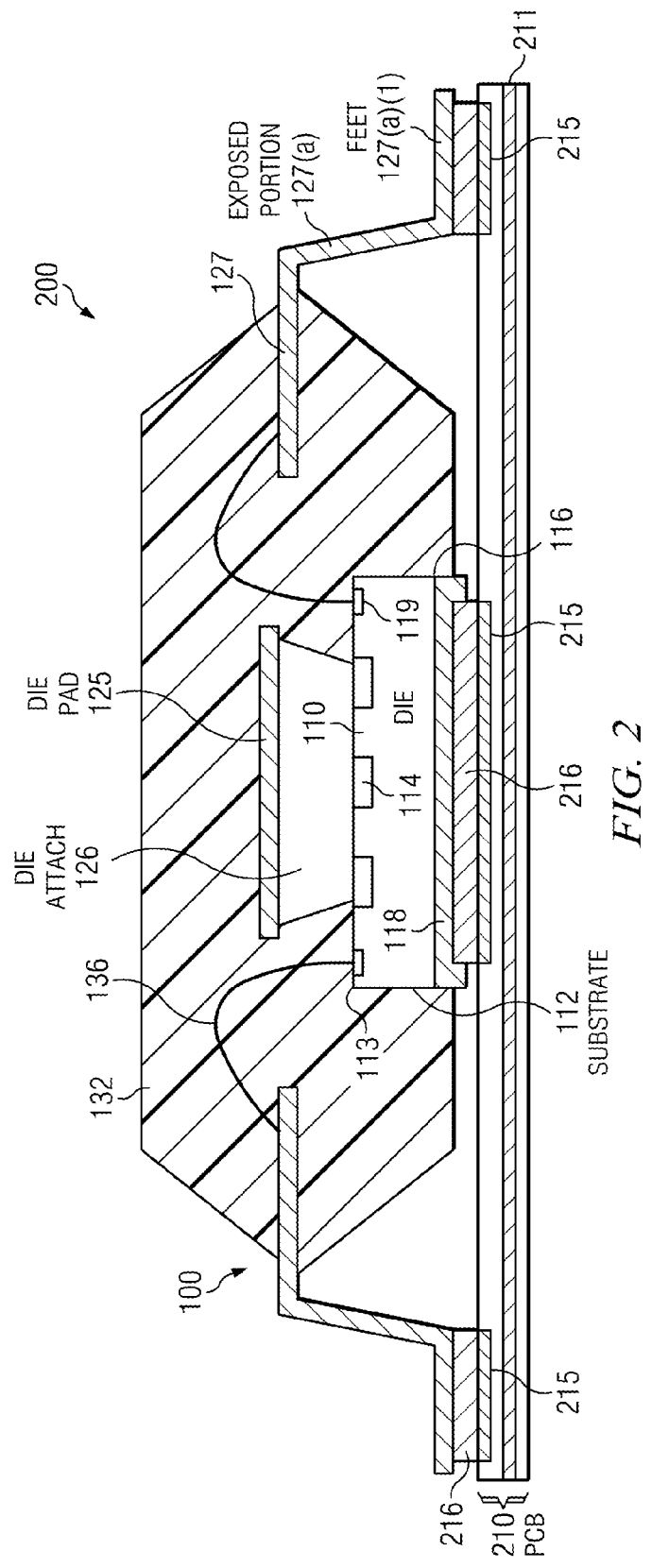
FIG. 2 is a cross sectional depiction of an example electronic assembly comprising the packaged semiconductor device shown in FIG. 1A surface mounted using a direct solder connection to a multi-layer PCB, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A is a cross sectional depiction of an example packaged semiconductor device 100 comprising a leaded package, with backside metal of the semiconductor die 110 exposed along a bottom surface of the package for direct surface mounting, according to an example embodiment. The semiconductor die 110 comprises a substrate (e.g., silicon or silicon/germanium) 112 having a topside 113 including active circuitry 114 and a bottomside 116, and at least one backside metal layer 118 on the bottomside 116 of the substrate 112. The active circuitry 114 on topside surface 113 of semiconductor die 110 is configured to provide an IC circuit function. The backside metal layer 118 is directly attached to the bottomside 116 of the semiconductor die 110.

A variety of backside metal layers 118 can be used. In one embodiment, the backside metal layer 118 is a single metal layer, such as a copper layer. The thickness of the copper layer is typically 3 μm to 6 μm, but can be thinner or thicker than this range. One example process involves forming a thin seed layer before forming the copper layer. In another embodiment, the backside metal layer comprises a first metal layer on the bottomside 116 of the semiconductor die 110 and a multi-layer metal stack comprising at least a second metal layer different from the first metal layer on the first metal layer. For example, the first metal layer can comprise titanium. Titanium is known to provide good adhesion with silicon and other semiconductors and thereby to create an effective "adhesion layer". Other embodiments may comprise tantalum, palladium, vanadium or molybdenum as the first layer in contact with the bottomside 116 of the semiconductor die 110. Like titanium, these metals provide good adhesion to silicon because they can form intermediate metal-silicides with silicon at relatively low temperatures. Some examples of specific multi-layer backside metal stacks include Cu on Ti, Ag on Ti, Cu on Ti, and stacks including first, second and third metal layers, such as Au on Ni on Ti, and Ag on Ni on Ti. A nickel layer can provide protection for underlying metal layers from mechanical scratching and corrosion.

In other example embodiments the first metal layer or second metal layer can comprises nickel. For example, Ag on Cr on Ni, or Pd on Ni on Au. Chromium can act as a barrier layer to stop metal diffusion into the substrate, provides a stress buffer layer, and also act to prevent fracturing inside the metal stack due to its high fracture strength. Typical thicknesses for the multi-layer metal stack can comprise 1 to 2 kÅ for the first metal layer, 2 to 4 kÅ for the second metal layer and 10 to 20 kÅ for the third metal layer. In the case of Au for the third metal layer, the Au thickness can be significantly thicker than 20 kÅ. However, the respective metal layer thicknesses can be thinner or thicker than these ranges.

An area of the backside metal layer 118 matches an area of the bottomside 116 of the semiconductor die 110. As used herein "directly attached" refers to a connection that does not include any intervening layers. Backside metal layer 118 matching an area of the bottomside 116 of the semiconductor die 110 is provided by the backside metal layer 118 being on the bottomside 116 of the semiconductor die 110 before singulation (e.g., backside metal layer 118 is deposited on the bottomside 116 of the substrate 112 while the semiconductor die 110 are in wafer form), so that the singulation process cuts the wafer into a plurality of semiconductor die each having an area that is constant during the cutting process through both the backside metal 118 and the substrate 112.

The package 130 in FIG. 1A is shown as a leaded package including a molding material 132, such as a standard epoxy-resin package material having a die pad 125 and a plurality of leads 127 that include a portion encapsulated within the molding material 132 and exposed portions 127(a) on which the leads shown are bent including a bonding portion 127(a)(1) shown as feet 127(a)(1).

The topside 113 of the semiconductor die 110 is attached to the die pad 125 by a die attach material 126, such as an epoxy. The backside metal layer 118 is exposed by a gap in the molding material 132 along a portion of the bottom surface 130(a) of the package 130. The package can be molded with a gap in the molding material so that the backside metal layer 118 is exposed. Backside metal layer 118 allows packaged semiconductor device 100 to be directly soldered to a package substrate, such as a PCB.

Directly soldering the backside metal layer 118 of packaged semiconductor device 100 to a package substrate (e.g., a PCB) provides good thermal transfer from the semiconductor die 110 to the package substrate. In this directly soldered arrangement, the thermal dissipation path has a minimum number of interfaces, including from the active devices 114 on the topside 113 of the semiconductor die 110 through the thickness of the substrate 112 and a tiny contribution across the backside metal 118, so that thermal dissipation for packaged semiconductor device 100 to the underlying workpiece is generally set by the thermal conductivity the substrate 112 for the semiconductor die 110, or about 140 W/m·K for a silicon substrate. In one embodiment, the semiconductor die 110 is a thinned die, such as 40 to 100 μm in thickness, to further enhance thermal transfer from the packaged semiconductor device to the workpiece.

In addition, direct solderability provided by packaged semiconductor device 100 reduces assembly cost as compared to conventional assembly, such as by eliminating the need for thermal grease and heat sinks, and added processing such to attach a heat sink. Moreover, direct soldering reduces board space for PCB assemblies, and eases PCB layout by enabling use of surface mount device (SMD) rules.

Bond wires 136 are shown for coupling bond pads 119 on the topside 113 of the semiconductor die 110 to the plurality of leads 127. The feet 127(a)(1), the bottom surface 130(a) of the package 130, and the backside metal layer 118 are all substantially planar to one another. As used herein, "substantially planar" refers to a maximum range between the lower edges of bonding portion of the leads for bonding to the workpiece (e.g., PCB) such as the feet 127(a)(1) shown in FIG. 1A, the bottom surface 130(a) of the package 130, and the backside metal layer 118 all being within a range of +/−0.25 mm (i.e. a maximum 0.5 mm tilt). This disclosed "substantially planar" arrangement facilitates direct surface mounting, such as for the example case where the soldering process comprises a solder paste onto a screen (mask) having a thickness of 0.3 to 0.5 mm on a workpiece such as a PCB. Moreover, as shown in FIG. 1A, the molding material 132 along the full length of the bottom surface 130(a) of the package 130 can also be substantially planar throughout (i.e. no indentation regions).

FIG. 1B is a cross sectional depiction of an example packaged semiconductor device 150 comprising a leadless package 180, with backside metal 118 of the semiconductor die 110 exposed along a bottom surface 180(a) of the package for direct surface mounting, according to an example embodiment. Package 180 includes a die pad 125 and plurality of exposed portions shown as perimeter terminating leads 181 (also sometimes referred to as perimeter lands) that do not extend beyond the molding material 132. Perimeter terminating leads 181 are substantially planar to the bottom surface 180(a) of the leadless package 180, and the backside metal 118. Leadless package 180 can comprise a variety of Flat No leads packages such as QFN (Quad Flat No leads) and DFN (Dual Flat No leads). Packaged semiconductor device 150 provides the directly solderability, high level of thermal, reduced assembly cost, reduced board space for PCB assemblies, and the same ease of board layout provided by packaged semiconductor device 100 described above.

FIG. 2 is a cross sectional depiction of an example electronic assembly 200, comprising the packaged semiconductor device 100 shown in FIG. 1A surface mounted using a direct solder connection to a multi-layer PCB 210 comprising at least one internal metal (e.g., copper) plane 211 and a plurality of surface pads 215. Direct solder connections 216 are shown for coupling the backside metal layer 118 and the feet 127(a)(1) of the packaged semiconductor device 100 to ones of the surface pads 215 on the PCB 210, such as copper surface pads.

Another disclosed embodiment is a method of forming an electronic assembly. A disclosed packaged semiconductor device, such as packaged semiconductor devices 100 or 150 described, is directly solder to a workpiece such as a PCB including a plurality of surface pads. The backside metal layer and the bonding portions of the plurality of leads are directly soldered to substrate pads on the PCB.

The active circuitry formed on the semiconductor wafers and the semiconductor die therefrom comprise circuit elements that may generally include transistors, diodes, capacitors, and resistors, as well as signal lines and other electrical conductors that interconnect the various circuit elements to provide an IC circuit function. As used herein "provide an IC circuit function" refers to circuit functions from ICs, that for example may include an application specific integrated circuit (ASIC), a digital signal processor, a radio frequency chip, a memory, a microcontroller and a system-on-a-chip or a combination thereof.

Disclosed embodiments can be integrated into a variety of assembly flows to form a variety of different IC devices and related products. The IC assembly can comprise single semiconductor die or multiple die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A packaged semiconductor device, comprising:
   a semiconductor die comprising a substrate having a topside including active circuitry and a bottomside, and at least one backside metal layer on said bottomside of said substrate, wherein said backside metal layer is directly attached to said bottomside of said semiconductor die and an area of said backside metal layer matches an area of said bottomside of said semiconductor die;
   a package including a molding material having a die pad and a plurality of leads encapsulated within said molding material, wherein said plurality of leads include an exposed portion that includes a bonding portion;
   wherein said topside of said semiconductor die is attached to said die pad, and wherein said package includes a gap that exposes said backside metal layer along a bottom surface of said package, and
   bond wires coupling pads on said topside of said semiconductor die to said plurality of leads,
   wherein said bonding portions, said molding material along said bottom surface of said package, and said backside metal layer are all substantially planar to one another.

2. The packaged semiconductor device of claim 1, wherein said exposed portions extend laterally beyond said molding material and are bent beyond said molding material, and said bonding portions comprise distal feet.

3. The packaged semiconductor device of claim 1, wherein said plurality of leads comprise a plurality of perimeter terminating leads that do not extend beyond said molding material, and wherein said plurality of perimeter terminating leads provide said bonding portions.

4. The packaged semiconductor device of claim 1, wherein said backside metal layer comprises copper.

5. The packaged semiconductor device of claim 1, wherein said backside metal layer comprises a first metal layer on said bottomside of said semiconductor die and at least a second metal layer different from said first metal layer on said first metal layer.

6. The packaged semiconductor device of claim 5, wherein said first metal layer comprises titanium.

7. The packaged semiconductor device of claim 5, wherein said first metal layer or said second metal layer comprises nickel.

8. The packaged semiconductor device of claim 5, wherein said first metal layer comprises titanium, said second metal layer comprises nickel, further comprising a third metal layer on said metal layer comprising gold or silver.

9. The packaged semiconductor device of claim 1, wherein said molding material along said bottom surface of said package is planar throughout.

10. An electronic assembly, comprising:
    a packaged semiconductor device, comprising:
       a semiconductor die comprising a substrate having a topside including active circuitry and a bottomside, and at least one backside metal layer on said bottomside of said substrate, wherein said backside metal layer is directly attached to said bottomside of said semiconductor die and an area of said backside metal layer matches an area of said bottomside of said semiconductor die;
       a package including a molding material having a die pad and a plurality of leads encapsulated within said molding material, wherein said plurality of leads include an exposed portion that includes a bonding portion;
       wherein said topside of said semiconductor die is attached to said die pad, and wherein said package includes a gap that exposes said backside metal layer along a bottom surface of said package, and
       bond wires coupling pads on said topside of said semiconductor die to said plurality of leads,
       wherein said bonding portions, said molding material along said bottom surface of said package, and said backside metal layer are all substantially planar to one another,
    a printed circuit board (PCB) including a plurality of surface pads, and
    direct solder connections from said backside metal layer and said bonding portions of said plurality of leads to ones of said plurality of surface pads on said PCB.

11. The electronic assembly of claim 10, wherein said PCB comprises a multi-layer PCB.

12. The electronic assembly of claim 10, wherein said exposed portions extend laterally beyond said molding material and are bent beyond said molding material, and said bonding portions comprise distal feet.

13. The electronic assembly of claim 10, wherein said plurality of leads comprise a plurality of perimeter terminating leads that do not extend beyond said molding material, and wherein said plurality of perimeter terminating leads provide said bonding portions.

14. The electronic assembly of claim 10, wherein said backside metal layer comprises copper.

15. The electronic assembly of claim 10, wherein said backside metal layer comprises a first metal layer on said bottomside of said semiconductor die and at least a second metal layer different from said first metal layer on said first metal layer.

16. The electronic assembly of claim 15, wherein said first metal layer comprises titanium.

\* \* \* \* \*